United States Patent
Kuo et al.

(10) Patent No.: US 6,183,606 B1
(45) Date of Patent: Feb. 6, 2001

(54) MANUFACTURE METHOD OF HIGH COERCIVITY FEPT-$Si_3N_4$ GRANULAR COMPOSITE THIN FILMS

(75) Inventors: Po-Cheng Kuo; Chih-Ming Kuo, both of Taipei (TW)

(73) Assignee: National Science Council of Republic of China (TW)

( * ) Notice: Under 35 U.S.C. 154(b), the term of this patent shall be extended for 0 days.

(21) Appl. No.: 09/433,784

(22) Filed: Nov. 3, 1999

(51) Int. Cl.[7] ............................ C23C 14/34; C23C 14/38; C23C 14/40

(52) U.S. Cl. .................... 204/192.15; 204/192.2; 204/192.22; 75/230; 75/244; 75/245; 75/246; 428/65.3; 428/411.1; 428/432; 428/433; 428/694 T; 428/692; 428/900; 428/698; 420/466; 420/128; 420/8

(58) Field of Search .......................... 204/192.15, 192.2, 204/192.22; 75/230, 244, 245, 246; 428/65.3, 411.1, 432, 433, 694 T, 692, 900, 698; 420/466, 128, 8

(56) References Cited

U.S. PATENT DOCUMENTS 5,824,409 * 10/1998 Sellmyer et al. ..................... 428/332
6,007,623 * 12/1999 Thiele et al. ............................ 117/95

OTHER PUBLICATIONS

Han et al, IEEE Trans. Magnetics, 33(5), pp. 3610–3612, Sep. 1997.*
Kuo et al, J. Appl. Phys. 87(1), pp. 419–426, Jan. 2000.*

* cited by examiner

Primary Examiner—Alan Diamond
(74) Attorney, Agent, or Firm—Birch, Stewart, Kolasch & Birch, LLP (57) ABSTRACT

A method of producing high coercivity FePt—$Si_3N_4$ granular composite thin films for magnetic recording media is invented. The method includes magnetron co-sputtering of FePt and $Si_3N_4$ targets at controlled sputtering power and sputtering argon gas pressure to form a selective composition of granular FePt—$Si_3N_4$ thin film on a low temperature substrate, then post-annealed in vacuum at selective time period and temperature. Two kinds of FePt targets can be used. One is the FePt alloy target. The other one is a composite target consisting of an iron disk overlaid with small Pt pieces. This arrangement provides a wide range of effective target compositions and therefore film compositions. FePt—$Si_3N_4$ films were deposited on natural oxidized silicon wafer or quartz glass substrate at room temperature. The as-deposited film has soft magnetic properties and granular structure with soft magnetic γ-FePt particles dispersed in amorphous $Si_3N_4$ matrix. The as-deposited film cannot be used as magnetic recording medium due to its low coercivity. After annealing at controlled conditions for a desirable temperature and time period in vacuum, the film also has granular structure but the magnetic soft γ-FePt phase is transformed into magnetic hard $γ_1$-FePt phase. This film has high coercivity and its magnetic easy-axis is parallel to the film plane. It may be used as high-density magnetic recording medium.

19 Claims, 8 Drawing Sheets

MANUFACTURE METHOD OF HIGH COERCIVITY FEPT-SI$_3$N$_4$ GRANULAR COMPOSITE THIN FILMS

BACKGROUND OF THE INVENTION

1. Field of the Invention

This invention includes the method for producing high coercivity FePt—Si$_3$N$_4$ granular composite thin films that may be used for high-density magnetic recording media.

2. Description of the Prior Art

For a long time now, the most important problem in magnetic recording medium has been how to increase its recording density. A high recording density medium needs high coercivity Hc and optimum remnant magnetization Mr for giant magnetic resistance (GMR) and MR read-heads.

At present, the CoCrPtM (M=Ni, Ta, W) alloy thin films are the most widely used magnetic recording materials for hard disk drive, due to their high coercivity (Hc>2800 Oe). However, these alloy thin films have two disadvantages for high recording density applications: (1) media noise is too high, and (2) coercivity is not enough, therefore the recording density can not be increased. For these metallic films, the most significant problem is the noise that results from magnetic exchange coupling between the grains located at the domain transition region (Jian-Gang Zhu, "Transition Noise Properties in Longitudinal Thin Film Media", IEEE Trans. Magn. Vol. 29, no.1, pp.195–200, 1993). On the other hand, if the areal recording density of the metallic film is to be increased, the grain size of the film must be reduced (D. N. Lambeth, E. M. T. Velu, G. H. Bellesis, L. L. Lee, and D. E. Laughlin, "Media for 10 Gb/in$^2$ Hard Disk Storage: Issues and Status", J. Appl. Phys., 78(8), pp.4496–4501, 1996). However, due to the lack of enough space among grains to reduce the magnetic exchange coupling between the grains, even the grain size of the continuous metallic film is decreased to single-domain size, the high media noise will lead to read-write error and system instability. (E. I. Kondorsky, "On the stability of certain magnetic modes in fine ferromagnetic particles", IEEE Trans. Magn. Vol. 15, no.5, pp.1209–1214, 1986).

To improve the disadvantages of cobalt-based alloy thin films described above, the present inventors have invented high coercivity granular thin films with FePt particles dispersed in a non-magnetically amorphous Si$_3$N$_4$ matrix, for use as a recording media for higher density magnetic recording. Since the magnetic FePt particles in these granular films are isolated, the media noise of the films can be largely reduced. In addition, by using high magnetocrystalline anisotropy FePt particles as recording material, the recording bits of this granular film can be reduced and recording density of the film will be increased, provided that the write ability of magnetic head is strong enough. These granular films for recording media has many other good properties such as oxidization resistance, corrosion resistance and wear resistance due to the magnetic particles being surrounded by an insulator material Si$_3$N$_4$.

SUMMARY OF THE INVENTION

The object of the present invention is to fabricate high coercivity FePt—Si$_3$N$_4$ granular thin films for high-density magnetic recording media.

A granular FePt—Si$_3$N$_4$ thin film with soft magnetic γ-FePt particles dispersed in amorphous Si$_3$N$_4$ matrix was prepared by the co-sputtering of a FePt target and Si$_3$N$_4$ target on a low temperature substrate. After an optimum heat treatment, a high coercivity FePt—Si$_3$N$_4$ granular thin film with magnetic hard γ$_1$-FePt particles dispersed in amorphous Si$_3$N$_4$ matrix is obtained. The granular thin film has a magnetic easy-axis parallel to the film plane.

Magnetic granular thin film has an especially artificial structure. Usually, the magnetic properties of granular thin film are different from that of continuous metal thin film due to the fact that the magnetic particles of granular film are isolated by non-magnetic material. Changing the non-magnetic material content of the film will change the magnetic particles' inter-particle distance, particle size, and particle shape. These parameters all directly affect the magnetic properties of the film.

The present inventors use FePt alloy as the magnetic particles of granular film media due to its high magnetocrystalline anisotropy constant ($K_u$=7×10$^7$ erg/cm$^3$), high curie temperature, and good stability. (M. Watanabe, T. Nakayama, K. Watanabe, T. Hirayama and A. Tonomura, "Microstructure and magnetic properties of high-coercive Fe—Pt alloy thin films", Mater. Trans., JIM. 37, pp.489–493, 1996). The high coercivity granular FePt—Si$_3$N$_4$ thin films produced by the method of the invention may be one of the most promising candidates for future high-density magnetic recording media. The method of the present invention includes using magnetron co-sputtering of a FePt and a Si$_3$N$_4$ target at a controlled sputtering power and argon gas pressure to form a selective composition of granular FePt—Si$_3$N$_4$ thin films on a low temperature substrate. The as-deposited film has a granular structure and soft magnetic properties. After annealing in a vacuum, the soft magnetic γ-FePt particles of as-deposited film are transformed into hard magnetic γ$_1$-FePt phase with a very high coercivity. These annealed films can be used for magnetic recording media.

DETAILED DESCRIPTION AND EMBODIMENT OF THE INVENTION

The granular FePt—$Si_3N_4$ composite thin films were produced by magnetron co-sputtering of FePt and $Si_3N_4$ targets on a natural oxidized silicon wafer substrate or a quartz glass substrate at room temperature then post-annealed in a vacuum. The as-deposited FePt—$Si_3N_4$ films have a granular structure with soft magnetic γ-FePt particles dispersed in amorphous $Si_3N_4$ matrix. After annealing in a vacuum, the $Si_3N_4$ matrix keeps an amorphous structure but the films have high coercivity. The magnetic easy-axis of these films are parallel to film plane. These films may be used as high-density magnetic recording media. The films have magnetic properties of, for example, Ms>375 emu/cm$^3$ and Hc>2000 Oe.

The granular FePt—$Si_3N_4$ composite thin films of this invention are prepared by a conventional magnetron sputtering system with a DC and a RF power supply then post-annealed in a vacuum. Two types of FePt targets were used in this invention; one is the FePt alloy target, the other one is the composite target consisting of iron (Fe) disk overlaid with small platinum (Pt) pieces. The FePt particle composition in the granular FePt—$Si_3N_4$ thin film is preferably in the range between 45 and 55 atomic percent Pt. For optimized magnetic properties a more narrow range of 48 to 52 atomic percent Pt is preferred. The base pressure in the sputtering chamber was 5×10$^{-7}$ Torr or lower. After a high purity argon gas (99.9995%) was introduced, the argon pressure $P_{Ar}$, was set at 0.3~20 mTorr. Sputtering rates of the pure FePt and pure $Si_3N_4$ films are dependent on $P_{Ar}$. In order to get good magnetic properties, the $P_{Ar}$ of 3~5 mTorr is preferred. The sputtering guns were charged with the following power levels: the applied DC power source was set at 40 W, and RF power source was varied from 30 to 280 W. The deposition rate of FePt is about 0.3 nm/s. A natural oxidized silicon wafer substrate or quartz glass substrate was used, and the substrate temperature was less than 45° C., for example, about 25° C. The sputtering conditions of the granular FePt—$Si_3N_4$ thin films are shown in table 1 and table 2. After deposition, the as-deposited film was post-annealed in vacuum (<1×10$^{-6}$ Torr) at, for example, a temperature between 400 and 800° C. with a time period between 5 and 90 minutes and then quenched in ice-water. The temperature of quenching liquid is less than 5° C., for example, about 0° C.

TABLE 1

The operating conditions of co-sputtering granular FePt-$Si_3N_4$ thin film.

| Substrate temperature(Ts) | Room temperature |
| --- | --- |
| RF power | 67~280 W |
| DC power | 26~40 W |
| Base vacuum | 5 × 10$^{-7}$ Torr |
| Distance between substrate and target | 6 cm |
| Argon pressure | 5 mTorr |
| Sputtering rate of the film(average) | ~24 nm/min |
| Argon flow rate | 50 ml/min |

TABLE 2 variations of $Si_3N_4$ volume fraction of the granular FePt-$Si_3N_4$ thin film with sputtering parameters.

| $Si_3N_4$ vol. fraction(%) | 0 | 10 | 20 | 30 | 40 | 50 |
| --- | --- | --- | --- | --- | --- | --- |
| DC power density (W/cm$^2$) | 2 | 2 | 2 | 2 | 2 | 2 |
| FePt sputtering rate (nm/s) | 0.3 | 0.3 | 0.3 | 0.3 | 0.3 | 0.3 |
| RF power density (W/cm$^2$) | 0 | 1.53 | 3.4 | 5.9 | 9.1 | 13.7 |
| $Si_3N_4$ sputtering rate (nm/s) | 0 | 0.035 | 0.08 | 0.138 | 0.2 | 0.3 |

The differences between this invention and prior art can be summarized as follows:
(1) In the prior art, granular FePt—$Si_3N_4$ composite thin films, especially high coercivity granular FePt—$Si_3N_4$ thin films which maybe used for high-density magnetic recording media have never been fabricated.
(2) In this invention, in order to get good granular structure of FePt—$Si_3N_4$ thin films, the optimum substrate temperature and DC sputtering power during deposition are near 25 and 40 W, respectively.
(3) In order to obtain high coercivity FePt—$Si_3N_4$ granular thin films for high-density magnetic recording, the composition of FePt particles in the as-deposited granular FePt—$Si_3N_4$ thin films must be close to $Fe_{50}Pt_{50}$. When the Pt content beyond 50 at. %, an excess of Pt atoms will lead to a decrease of the magnetic properties of annealed film.
(4) In this invention, the high coercivity FePt—$Si_3N_4$ granular thin films for high-density magnetic recording media were formed by a phase transformation reaction, i.e. a preliminary soft magnetic γ-FePt phase was formed, and then it was transferred to a high magnetocrystalline anisotropy hard magnetic $γ_1$-FePt phase after an annealing treatment.
(5) In this invention, in order to get the high coercivity FePt—$Si_3N_4$ granular thin films for high-density magnetic recording media, the optimum annealing temperature and annealing time are near 600° C. and 30 minutes, respectively.
(6) In this invention, in order to get the high coercivity FePt—$Si_3N_4$ granular thin films for high-density magnetic recording media, the optimum quenching temperature after annealing is 0° C.

More examples and experiment results of the invention will be set forth below to affirm above conclusion. Magnetic properties of the films were measured with superconducting quantum interference device (SQUID) at room temperature. Microstructure of the films was characterized by transmission electron microscopy (TEM). Composition and homogeneity of the films were determined by energy disperse X-ray diffractometer (EDX).

EXAMPLE 1

Figure 1:
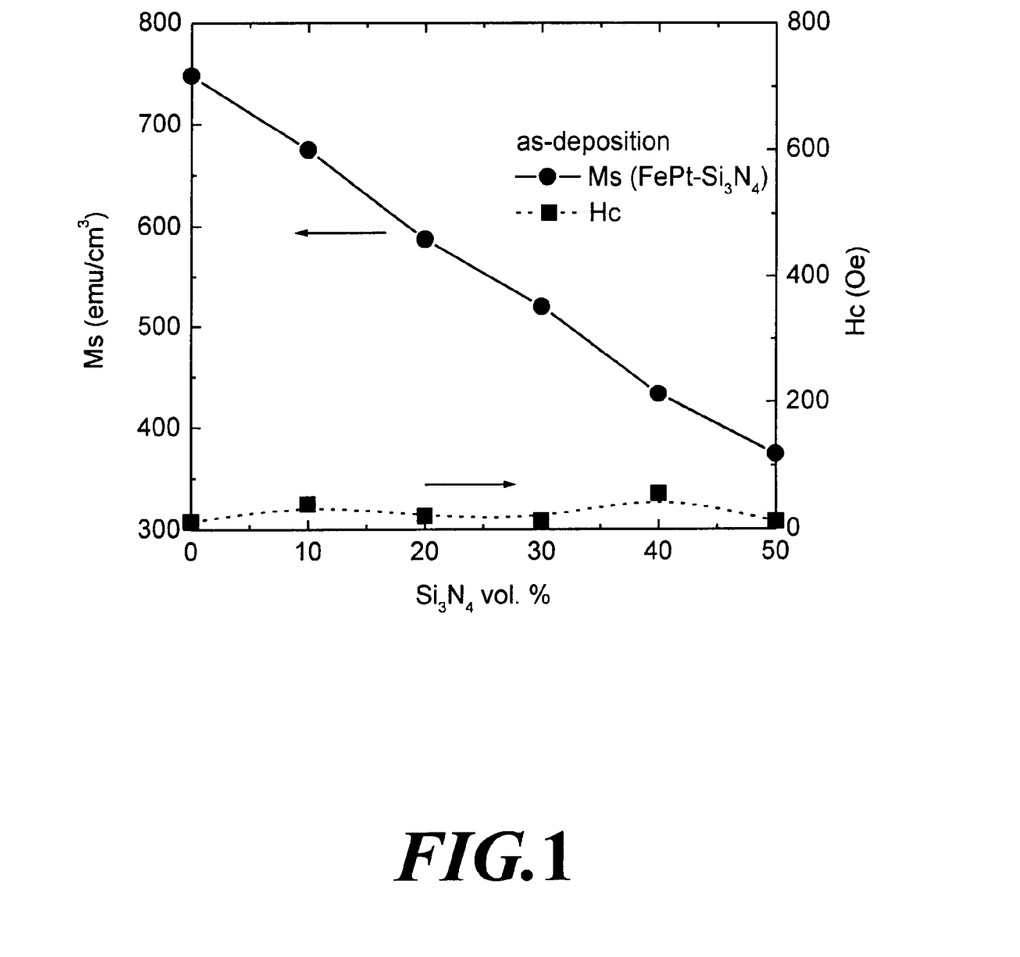
FIG. 1. illustrates the relationships among saturation magnetization Ms, in-plane coercivity Hc and Si$_3$N$_4$ volume fraction of the as-deposited FePt—Si$_3$N$_4$ film. Si$_3$N$_4$ volume fraction of the film is varied from 0 to 50 vol. %.

The initial substrate temperature was at room temperature. The substrate rotates at a speed of 75 rpm. After the sputtering chamber was evacuated to 5×10$^{-7}$ Torr, Ar gas was introduced into the chamber. The Ar pressure was maintained at about 5 mTorr during the entire sputtering period. The deposition rates of films are shown in table 2. FIG. 1 shows the relationships among saturation magnetization Ms, in-plane coercivity Hc, and $Si_3N_4$ volume fraction $V_f$ of the as-deposited FePt—$Si_3N_4$ films. The Ms value of the film decreased linearly with increasing $V_f$. The Ms value is about 750 emu/cm$^3$ when $V_f$ is 0 vol. %(pure FePt film), and as $V_f$ is increased to 50 vol. %, it decreases to about 375 emu/cm$^3$, which is only one half of the pure FePt film. It can be understood that $Si_3N_4$ is a non-magnetic phase, and it plays only the simple role of diluting the magnetization of the film. The variation of Hc with $V_f$ was small, as $V_f$ was between 0 vol. % and 50 vol. % $Si_3N_4$. Hc remained at about 50 Oe.

Figure 2:
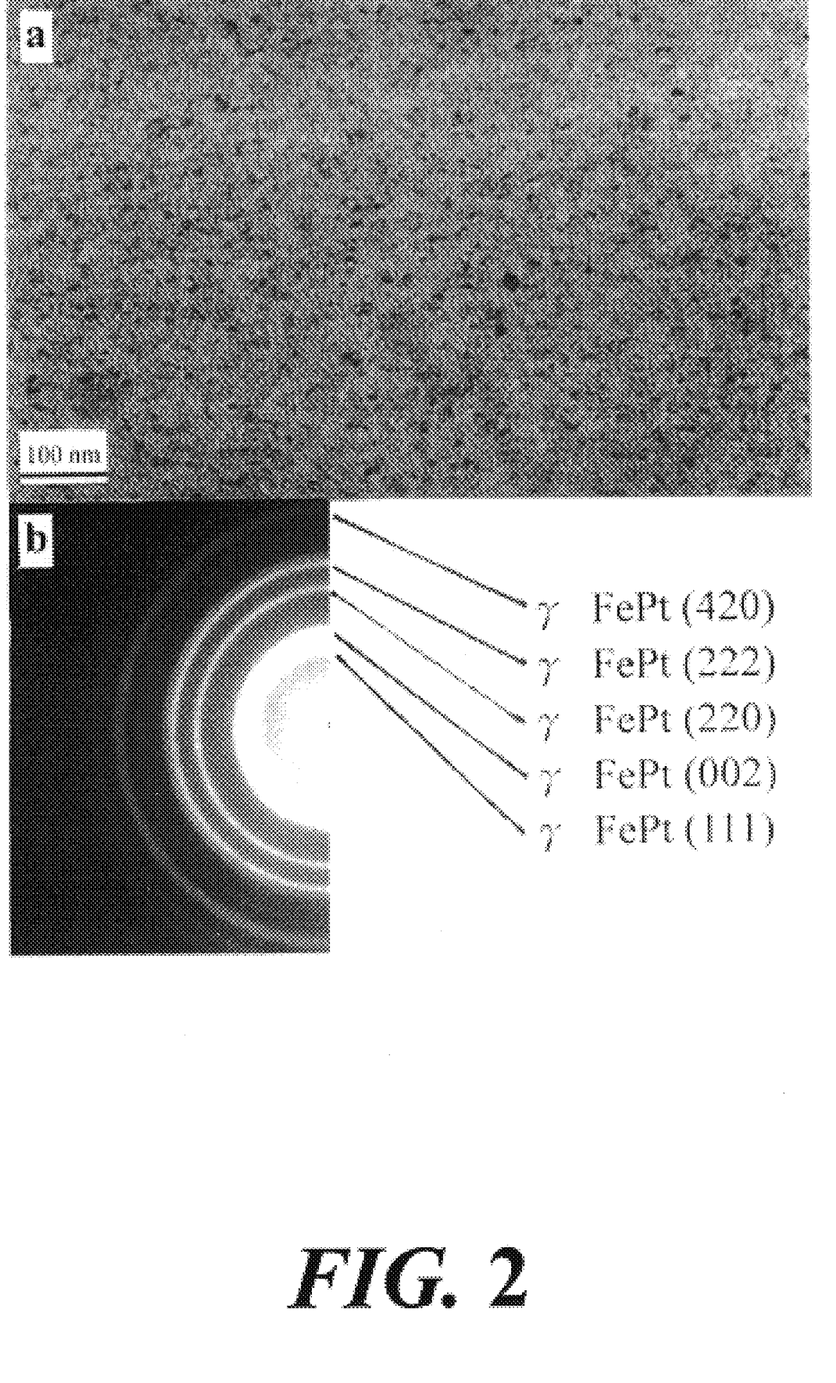
FIG. 2. is a TEM micrograph and electron diffraction pattern of the as-deposited (FePt)$_{80}$—(Si$_3$N$_4$)$_{20}$ film. (a) is the bright field image and (b) is the selected area diffraction (SAD) pattern of (a).

FIG. 2(a) is the TEM bright field image of the as-deposited $(FePt)_{80}$—$(Si_3N_4)_{20}$ film. The film thickness is 200 nm. It reveals that the average particle size of FePt is about 5 nm. The network-like structure results because the FePt particles are surrounded by a $Si_3N_4$ matrix. FIG. 2(b) is the selected area diffraction (SAD) pattern of FIG. 2(a). The well-marked diffraction rings indicate that the structure of the as-deposited film was not amorphous. As we compared this TEM diffraction pattern with that of the sputtered pure $Si_3N_4$ film, we confirmed that the $Si_3N_4$ film has an amorphous structure in the as-deposition film. From the TEM diffraction pattern analysis, we know that the crystal phase of the as-deposited film is fcc γ-FePt phase, as shown in FIG. 2(b). From FIG. 2(a) we could see this film has a granular structure, it is suitable for the further heat-treatment.

EXAMPLE 2

Figure 3:
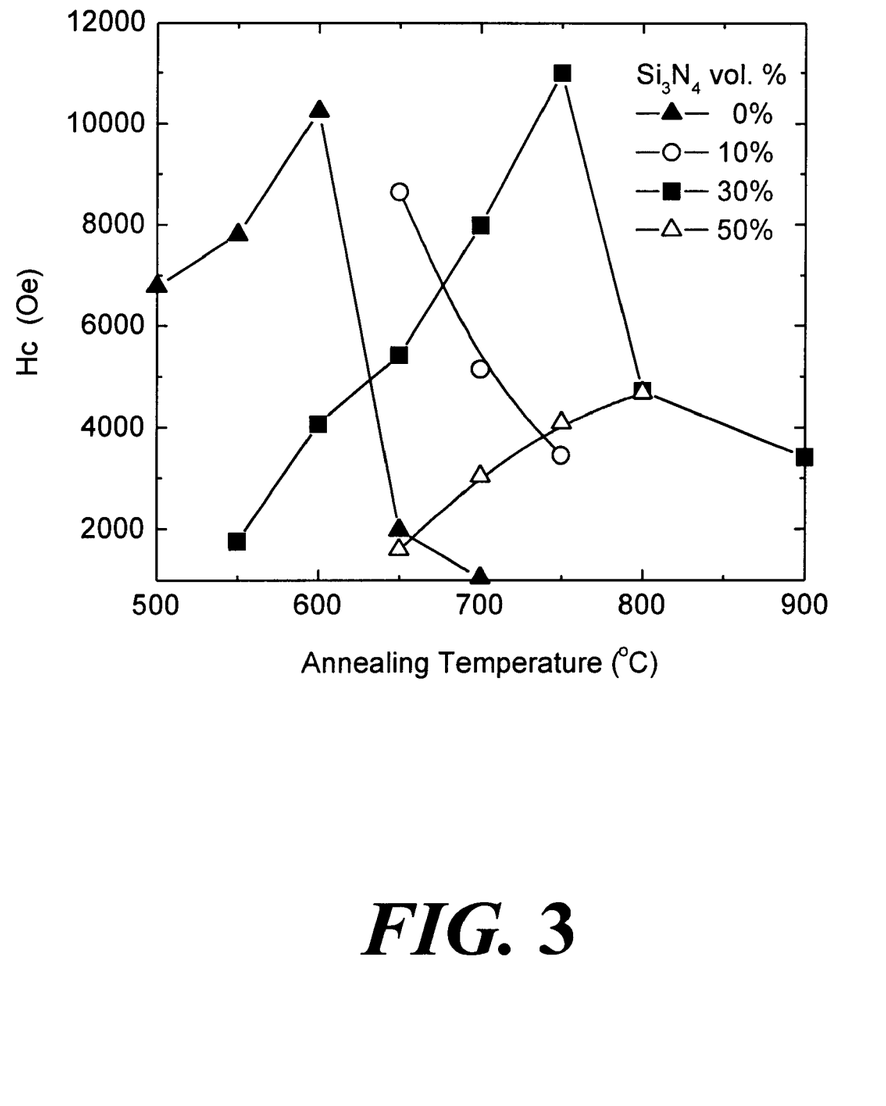
FIG. 3. illustrates the variations of the in-plane coercivity Hc with annealing temperature of various FePt—Si$_3$N$_4$ films; Si$_3$N$_4$ contents of the films are 0, 10, 30, and 50 vol. %, respectively. The film is ice-water quenched after annealing.

The sputtering conditions and the FePt composition were the same as example 1. FIG. 3 shows the relationships between the in-plane coercivity Hc and annealed temperature $T_{an}$ of the annealed FePt—$Si_3N_4$ films with various $Si_3N_4$ volume fractions (vol. %=0, 10, 30, and 50). The film is quenched in ice-water after annealing. As $V_f$ is equal to 0 vol. % (i.e. pure $Fe_{50}Pt_{50}$), the Hc value can reach 10 kOe after the film is annealed at 600° C. As $T_{an}$ is higher than 650° C., the Hc value of pure $Fe_{50}Pt_{50}$ film is lower than 2 kOe. For the $(FePt)_{70}$—$(Si_3N_4)_{30}$ film, its Hc value is about 2 kOe as $T_{an}$=550° C., and it increases rapidly with increasing $T_{an}$ to reach its maximum value of 11 kOe at $T_{an}$=750° C. then quickly decreases as $T_{an}$ is increased further. For this film, the increase of Hc value with increasing $T_{an}$ as $T_{an}$<750° C. is due to the gradual transformation of the soft γ-FePt phase to the hard $γ_1$-FePt phase, and the $γ_1$-FePt phase has very high magnetocrystalline anisotropy constant. As $T_{an}$>750° C., the decrease of Hc value with increasing $T_{an}$ is due to the growth of FePt grains and the reaction of FePt with the Si substrate.

From FIG. 3 we also can see that the increase of $Si_3N_4$ content in the film will increase the annealing temperature required for getting high coercivity. Pure $Fe_{50}Pt_{50}$ film must be annealed between 500° C. and 600° C., resulting in a coercivity higher than 3 kOe; however, adding 30 vol. % of $Si_3N_4$ raises this temperature range to between 600 and 900° C. This is due to the fact that the amorphous $Si_3N_4$ phase postpones the initial temperature, which transforms the fcc γ-FePt phase to the fct $γ_1$-FePt phase. For pure FePt film, the as-deposited γ-FePt thin film included the nucleation site of $γ_1$-FePt phase. For the as-deposited FePt—$Si_3N_4$ film, the FePt particles are surrounded by the insulator $Si_3N_4$, which is a poor heat-conductor. The γ-FePt particles in as-deposited FePt—$Si_3N_4$ film can not be transformed to $γ_1$-FePt phase completely by quenching the film in ice-water after annealing. The $Si_3N_4$ content would affect the magnetic hardness of the granular FePt—$Si_3N_4$ film after annealing. From FIG. 3 we can see that the addition of the amorphous $Si_3N_4$ phase can raise the initial phase transformation temperature at which γ-FePt is transformed into the $γ_1$-FePt phase. The coercivity of annealed FePt—$Si_3N_4$ film could be larger than that of pure FePt film due to the completely isolated small FePt grains with appropriate inter-granular distance and the stress anisotropy of the particles. As the amount of the magnetic phase is fixed, not only the magnetic grain size but also the inter-granular distance were increased with increasing annealing temperature. The growth of magnetic FePt grains would decrease the coercivity of granular film.

In general, post-annealed FePt—$Si_3N_4$ film's Hc value is increased with increasing $T_{an}$, and after it reaches its maximum values at some characteristic $T_{an}$, it will decrease again.

As 30-vol. %~50 vol. % $Si_3N_4$ is added in pure $Fe_{50}Pt_{50}$ film, the $Si_3N_4$ phase in the FePt—$Si_3N_4$ granular film will protect the FePt particles at high temperatures. However, Ms value of the film is decreased linearly with increasing $V_f$. The coercivities of the $(FePt)_{70}$—$(Si_3N_4)_{30}$ films that annealed between 550~600° C. are between 3000 Oe and 4000 Oe, and their Ms values are about 525 emu/cm³. These films are suitable for high-density magnetic recording media.

EXAMPLE 3

Figure 4:
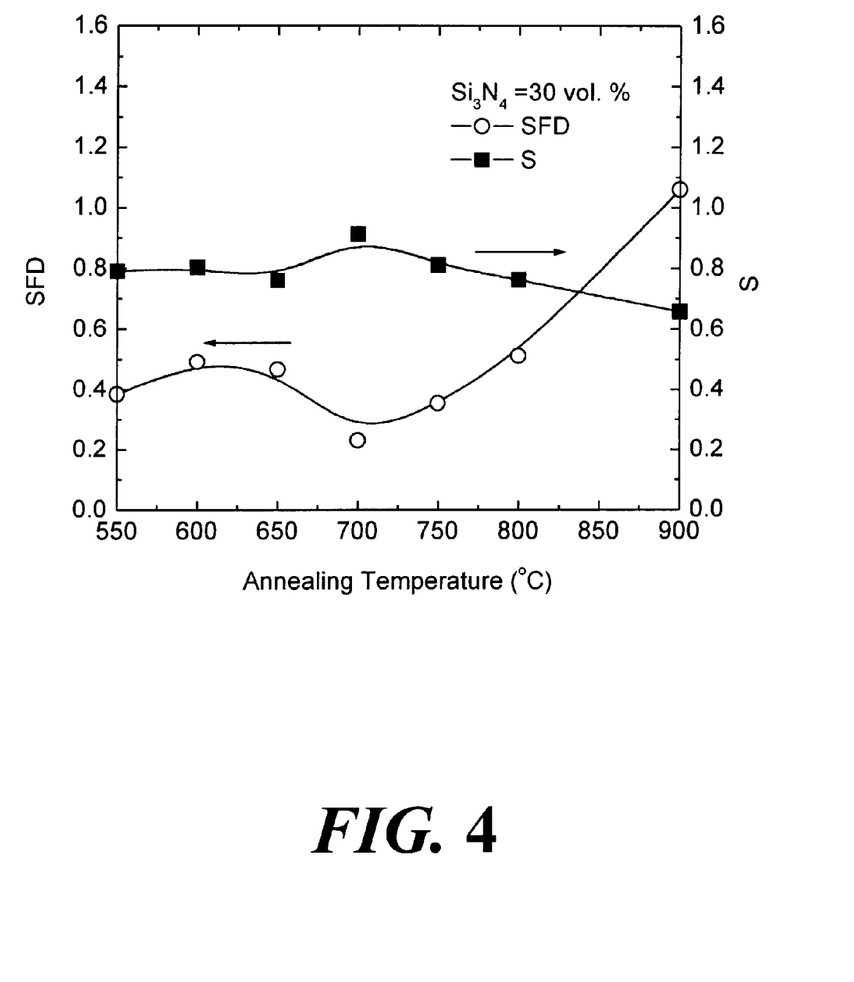
FIG. 4. illustrates the variations of in-plane squareness (S=Mr/Ms) and switching field distributions (SFD) with annealing temperature of the (FePt)$_{70}$—(Si$_3$N$_4$)$_{30}$ film. The film is ice-water quenched after annealing.

The sputtering conditions and the FePt composition were the same as example 1. FIG. 4 shows the relationships among in-plane squareness (S=Mr/Ms), switching field distribution (SFD), and $T_{an}$ of the $(FePt)_{70}$—$(Si_3N_4)_{30}$ film, which is ice-water quenched after annealing. The annealing time is 30 min. We found that both the maximum S value and the minimum SFD value occur at $T_{an}$=700° C. The maximum S value is about 0.9, and the minimum SFD value is about 0.2. As $T_{an}$<700° C., the S value is kept about 0.8. As $T_{an}$>700° C., the S value decreases slowly with increasing $T_{an}$. For the film used in magnetic recording media needs high S value and low SFD value.

The variation of SFD value with $T_{an}$ is small as $T_{an}$<700° C. But it increases rapidly with increasing $T_{an}$ as $T_{an}$>700° C. For $T_{an}$=900° C., the SFD value is about 1.1. For the annealing temperature between 550° C. and 800° C., the annealed films are all suitable for magnetic recording media if we choose 0.5 and 0.75 as the margins of SFD and S, respectively.

EXAMPLE 4

Figure 5:
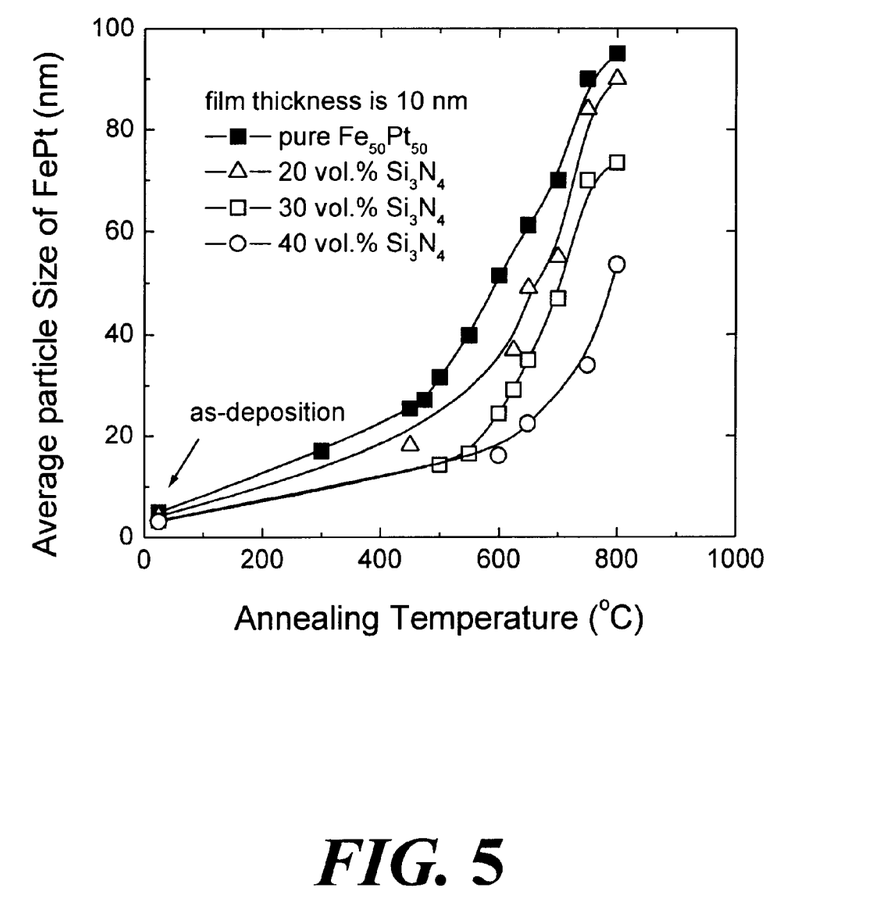
FIG. 5. illustrates the variations of average FePt particle size with annealing temperature of various FePt—Si$_3$N$_4$ films. Si$_3$N$_4$ contents of the films are 0, 20, 30, and 40 vol. %, respectively. The film thickness is 10 nm and the film is ice-water quenched after annealing.

The sputtering conditions and the FePt composition were the same as example 1. From the observations of TEM images, we found that the average particle size of FePt—$Si_3N_4$ composite film grows more slowly than that of pure FePt film when the annealing temperature is increased. FIG. 5 shows the relationships among FePt particle size, $V_f$, and $T_{an}$ of various FePt—$Si_3N_4$ films. The film thickness is 10 nm and the film is ice-water quenched after the annealing process. We can see that at the same $T_{an}$, the particle size of FePt in composite FePt—$Si_3N_4$ film is decreased as $V_f$ is increased. This is due to the fact that the grain growth of magnetic FePt particle is limited by surrounding $Si_3N_4$ matrix. As $T_{an}$=600° C., the average grain size of pure FePt film is about 90 nm, and it is only about 20 nm in the $(FePt)_{70}$—$(Si_3N_4)_{30}$ film. As $T_{an}$=650° C., the average grain size of pure FePt film is about 70 nm, and it is only about 30 nm in the $(FePt)_{60}$—$(Si_3N_4)_{40}$ film. The effect of $Si_3N_4$ addition is not only changing the film's coercivity but also limiting the grain growth of magnetic FePt phase during annealing.

EXAMPLE 5

Figure 6:
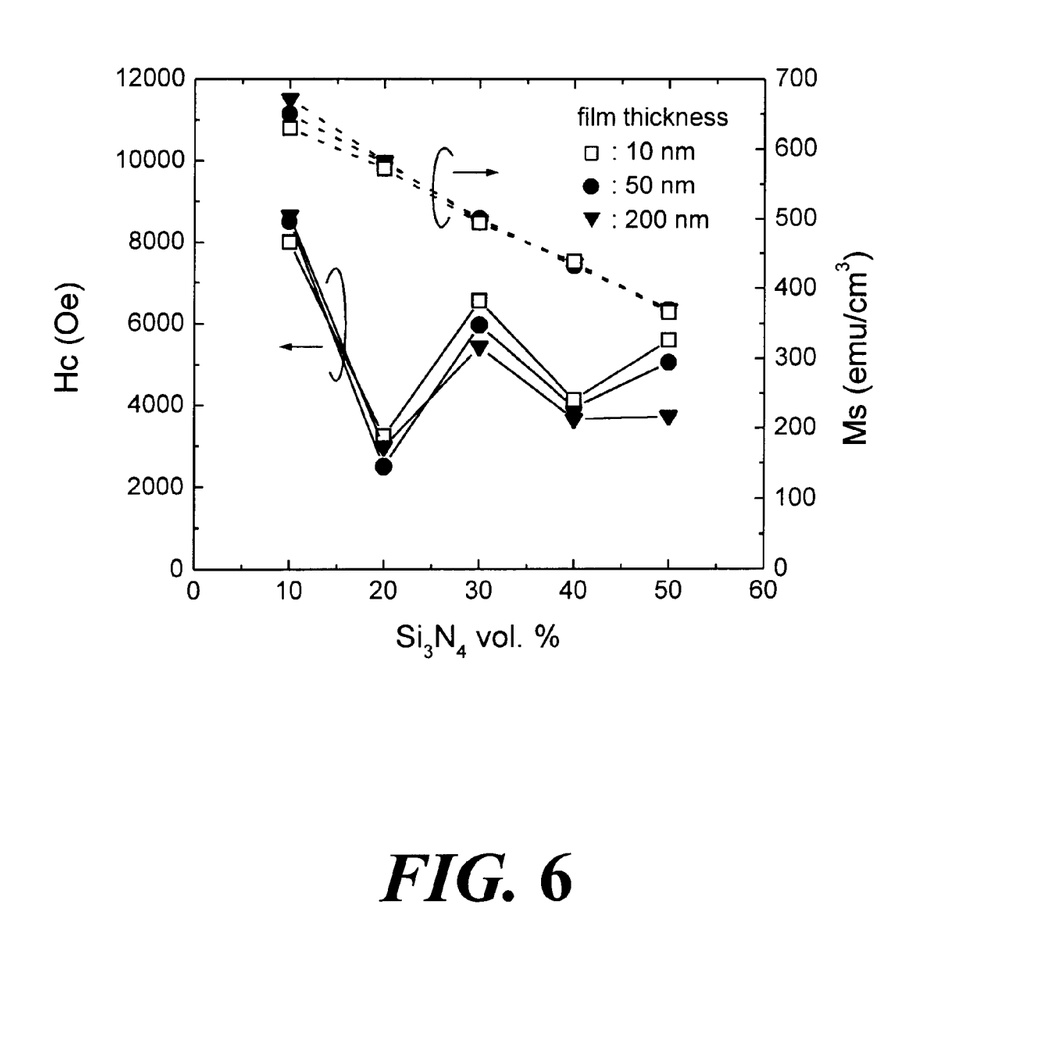
FIG. 6. The relationships among saturation magnetization Ms, in-plane coercivity Hc, and Si$_3$N$_4$ volume fraction of various annealed FePt—Si$_3$N$_4$ films with film thickness of 10-nm, 50-nm, and 200-nm, respectively. These films were annealed at 650° C. for 30 min and ice-water quenched after annealing.

The sputtering conditions and the FePt composition were the same as example 1. FIG. 6 shows the relationships among Ms, Hc, and $V_f$ of various annealed FePt—Si$_3$N$_4$ granular films with film thickness of 10 nm, 50 nm, and 200 nm, respectively. These films were annealed at 650° C. for 30 min and ice-water quenched after annealing. It can be seen that the Ms value is independent of the film thickness but decreased linearly with increasing $V_f$. The dependence of the Hc value on film thickness is small. However, the variation of Hc value with $V_f$ vibrated like a sine curve. The amplitude of this sine curve is decreased as $V_f$ is increased. This phenomenon may be due to the fact that the particle size of FePt is decreased with increasing $V_f$ and the stress anisotropy of FePt particles is varied with $V_f$.

Figure 7:
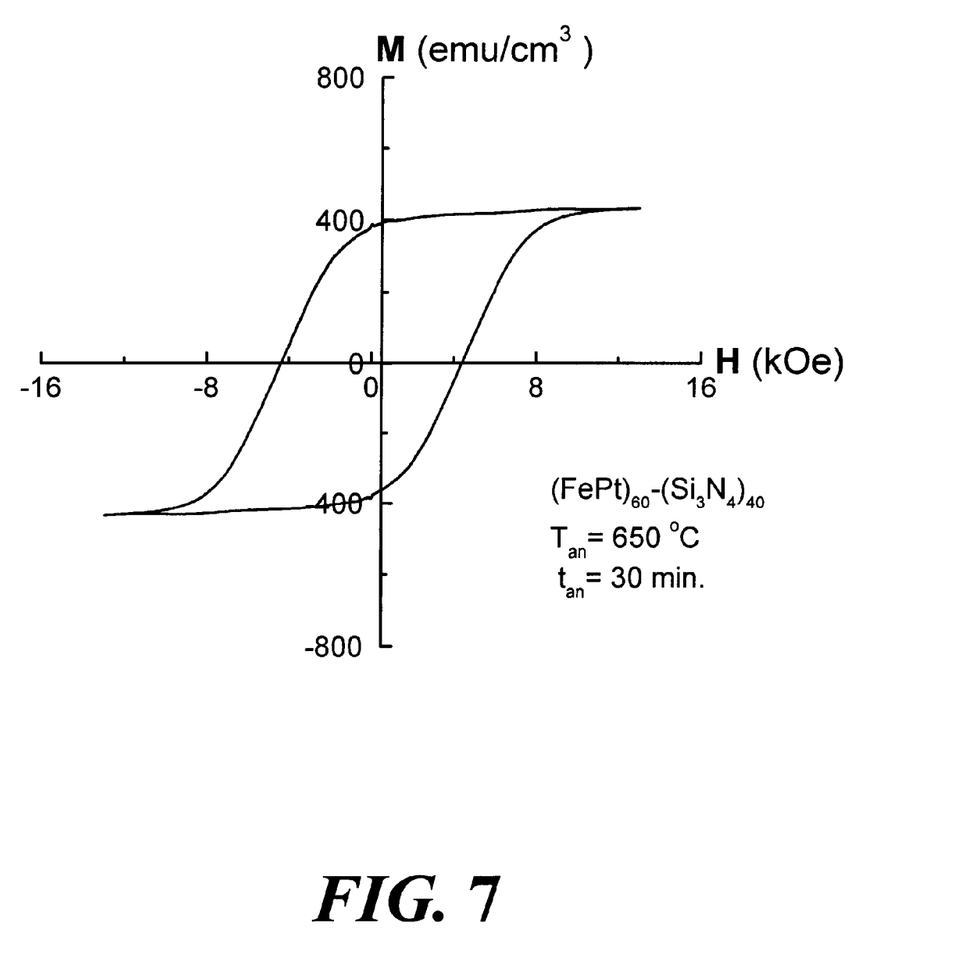
FIG. 7. is the M-H loop of granular (FePt)$_{60}$—(Si$_3$N$_4$)$_{40}$ film which was annealed at 650° C. for 30 min then ice-water quenched. The film thickness is 200 nm and the applied field is parallel to the film plane.

FIG. 7 shows the M-H loop of the annealed (FePt)$_{60}$—(Si$_3$N$_4$)$_{40}$ film. The applied field is parallel to the film plane. The sputtering conditions and the FePt composition were the same as example 1. The annealing temperature is 650° C. and the annealing time is 30 min. We can see that the Hc value of this film is about 4000 Oe and the Ms value is about 450 emu/cm$^3$. Comparing FIG. 6 with FIG. 1, it can be seen that the Ms value of (FePt)$_{60}$—(Si$_3$N$_4$)$_{40}$ film does not change after annealing, however, coercivity of the annealed film is much higher than that of the as-deposited film.

Figure 8:
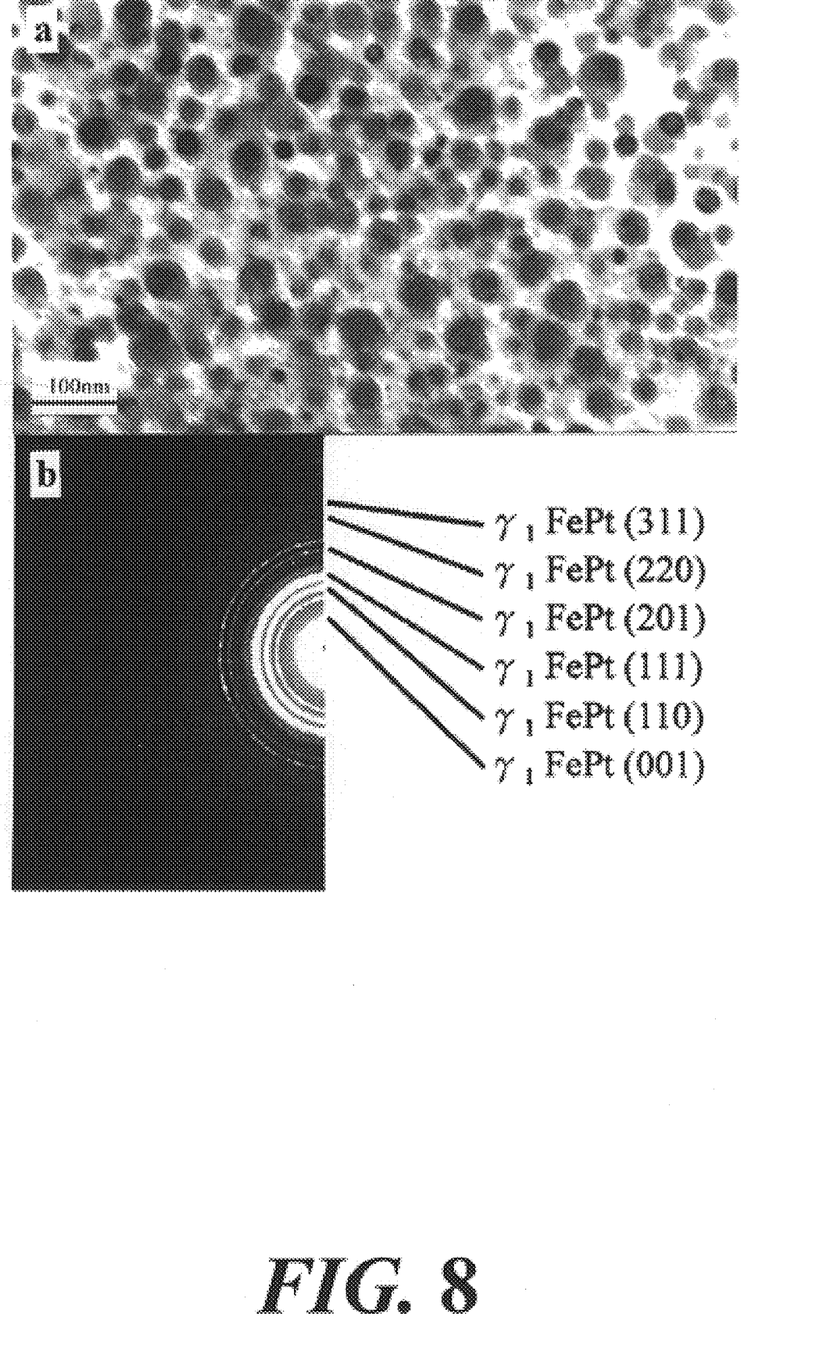
FIG. 8. is a TEM micrograph and electron diffraction pattern of the $(FePt)_{60}$—$(Si_3N_4)_{40}$ film which was annealed at 650° C. for 30 min then ice-water quenched. (a) is the bright field image and (b) is the SAD pattern of (a).

FIGS. 8(a) and 8(b) are the TEM bright field image and electron diffraction pattern of the annealed (FePt)$_{60}$—(Si$_3$N$_4$)$_{40}$ film, which was annealed at 650° C. for 30 min then ice-water quenched. Thickness of the film is 200 nm. It is obvious that the spherical FePt particles are dispersed in amorphous Si$_3$N$_4$ matrix, and they form a typical granular structure. FIG. 8(b) reveals that the FePt particle of this film is fct $\gamma_1$-FePt phase. Additionally, when we indexed this diffraction pattern's rings with JCPDS, it was confirmed that the Si$_3$N$_4$ phase still maintains an amorphous state after annealing at this temperature.

What is claimed is:

1. A method for producing high coercivity FePt—Si$_3$N$_4$ granular composite thin film, comprising the steps of:
   (a) co-sputtering an FePt target and a Si$_3$N$_4$ target on a substrate by use of a conventional magnetron sputtering system to form a deposited film;
   (b) annealing the film in a vacuum under controlled conditions for an annealing temperature and time period; and
   (c) quenching the film in a quenching liquid to form a post-annealed FePt—Si$_3$N$_4$ granular film having magnetic properties of Ms>375 emu/cm$^3$ and Hc>2000 Oe, respectively.

2. The method of claim 1, wherein a power supply for the magnetron sputtering system is selected from the group consisting of DC and RF.

3. The method of claim 1, wherein the FePt target is selected from the group consisting of an FePt alloy target and an FePt composite target, wherein said composite target comprises an iron disk overlaid with platinum pieces.

4. The method of claim 1, wherein said substrate is a natural oxidized silicon wafer or a quartz glass substrate.

5. The method of claim 1, wherein step (a) is performed with an argon pressure ($P_{Ar}$) of between 0.3 and 20 mTorr.

6. The method of claim 5, wherein the argon pressure ($P_{Ar}$) is about 5 mTorr.

7. The method of claim 1, wherein the substrate has a temperature of less than 45 degrees Celsius.

8. The method of claim 7, wherein the substrate temperature is about 25 degrees Celsius.

9. The method of claim 1, wherein an atomic ratio of Fe:Pt in the granular composite film is in the range of 55:45 to 45:55.

10. The method of claim 9, wherein the atomic ratio of Fe:Pt in the granular composite film is about 50:50.

11. The method of claim 1, wherein a volume fraction of FePt:Si$_3$N$_4$ in the granular composite film is in the range of 80:20 to 50:50.

12. The method of claim 11, wherein the volume fraction of FePt:Si$_3$N$_4$ in the granular composite film is about 70:30.

13. The method of claim 1, wherein the vacuum has a working pressure of lower than 1×10$^{-6}$ Torr.

14. The method of claim 1, wherein the annealing temperature is between 400 and 800 degrees Celsius and the time period is between 5 and 90 minutes.

15. The method of claim 14, wherein the annealing temperature is about 600 degrees Celsius and the time period is 30 minutes.

16. The method of claim 1, wherein the quenching liquid is water.

17. The method of claim 16, wherein the water has a temperature of about 0 degrees Celsius.

18. The method of claim 1, wherein the quenching liquid has a temperature of less than 5 degrees Celsius.

19. The method of claim 1, wherein said FePt—Si$_3$N$_4$ granular composite thin film serves as a magnetic recording media.

* * * * *